(12) United States Patent
Kwon et al.

(10) Patent No.: US 8,729,538 B2
(45) Date of Patent: May 20, 2014

(54) ORGANIC LIGHT EMITTING DIODE DEVICE AND METHOD FOR FABRICATING THE SAME

(71) Applicant: LG Display Co., Ltd., Seoul (KR)

(72) Inventors: Dhang Kwon, Gyeonggi-Do (KR); JungHo Son, Gyeonggi-Do (KR); JungHyun Lee, Gyeonggi-Do (KR)

(73) Assignee: LG Display Co., Ltd., Seou (KR)

( * ) Notice: Subject to any disclaimer, the term of this patent is extended or adjusted under 35 U.S.C. 154(b) by 0 days.

(21) Appl. No.: 13/726,955

(22) Filed: Dec. 26, 2012

(65) Prior Publication Data

US 2014/0070174 A1 Mar. 13, 2014

(30) Foreign Application Priority Data

Sep. 10, 2012 (KR) .......................... 10-2012-0100057

(51) Int. Cl.
*H01L 51/54* (2006.01)
(52) U.S. Cl.
USPC .............................................. 257/40; 438/82
(58) Field of Classification Search
USPC .............................................. 257/40; 438/82
See application file for complete search history.

(56) References Cited

U.S. PATENT DOCUMENTS

| 7,919,773 | B2 * | 4/2011 | Kawakami et al. | 257/40 |
| 2005/0012091 | A1 * | 1/2005 | Huang | 257/40 |
| 2006/0131568 | A1 * | 6/2006 | Meng et al. | 257/40 |
| 2011/0108812 | A1 * | 5/2011 | Sumita et al. | 257/40 |
| 2011/0180789 | A1 * | 7/2011 | Han et al. | 257/40 |
| 2013/0015458 | A1 * | 1/2013 | Ko et al. | 257/71 |

\* cited by examiner

*Primary Examiner* — Thao P Le
(74) *Attorney, Agent, or Firm* — Morgan, Lewis & Bockius LLP

(57) ABSTRACT

The organic light emitting diode (OLED) device includes a first substrate defined by a display area and a panel edge portion surrounding the display area, a thin film transistor, a first electrode connected to the thin film transistor, a bank formed on the first substrate, an organic light emitting layer formed on the display area of the first substrate, a second electrode formed on an entire surface of the first substrate having the organic light emitting layer, an anti-moisture permeation pattern formed on the second electrode on the bank located at the panel edge portion, a passivation layer formed on an entire surface of the first substrate and a second substrate attached to the first substrate.

10 Claims, 10 Drawing Sheets

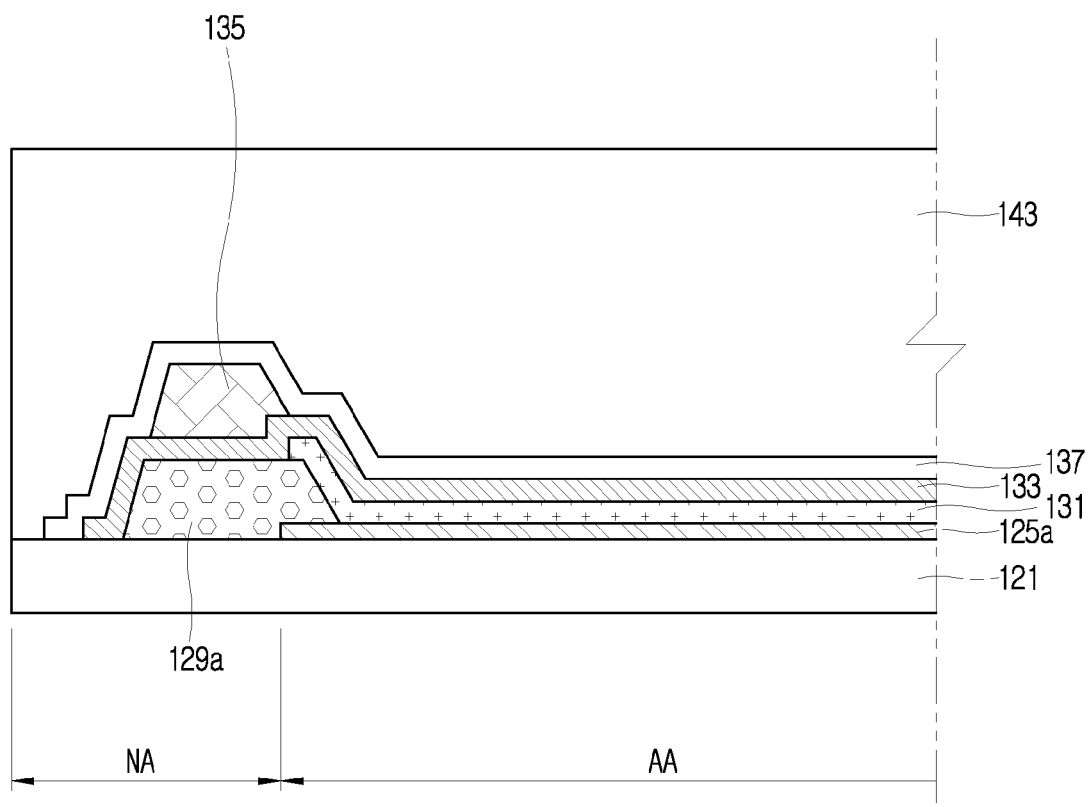

ORGANIC LIGHT EMITTING DIODE DEVICE AND METHOD FOR FABRICATING THE SAME

CROSS-REFERENCE TO RELATED APPLICATION

Pursuant to 35 U.S.C. §119(a), this application claims the benefit of earlier filing date and right of priority to Korean Application No. 10-2012-0100057, filed on Sep. 10, 2012, the contents of which is incorporated by reference herein in its entirety.

BACKGROUND OF THE INVENTION

1. Field of the Invention

This specification relates to an organic light emitting diode (OLED) device, and particularly, to an OLED device capable of preventing permeation of external moisture, oxygen and the like, and a fabricating method thereof.

2. Background of the Invention

Although cathode ray tube (CRT) display devices were widely used as a display device, flat panel display (FPD) devices, such as a plasma display panel (PDP) device, a liquid crystal display (LCD) device, an organic light emitting diode (OLED) device, which may be referred to as an organic electroluminescent display (OELD) device, and the like, have been the subject of recent research and development as substitutes of the CRT.

Among others, OLED devices as a self-light emitting device have advantages of a light weight and a thin profile due to omission of a backlight unit, which is used for the LCD devices as a non-light emitting device.

The OLED devices have a viewing angle and a contrast ratio superior to LCD devices, and have advantages in a power consumption so as to be driven with a direct current (DC) low voltage. Further, the OLED devices have a fast response speed, an excellent durability against an external impact by virtue of a solid internal display device and a wide operation temperature range.

Especially, the fabricating process of the OLED device is simplified, accordingly, the OLED device is less expensive to produce than the conventional LCD device.

The OLED devices exhibiting such characteristics may be classified into a passive matrix type and an active matrix type. In the passive matrix type OLED device, signal lines cross each other in a matrix pattern. In the active matrix type OLED device, a Thin Film Transistor (TFT) as a switching element is arranged for each pixel to switch on or off the corresponding pixel.

Since the passive matrix type OLED devices have disadvantages in resolution, power consumption, lifespan and the like, active matrix type OLED devices having advantages of high resolution and large screen have been the subject of recent research and development.

In terms of those characteristics, a structure of an OLED according to the related art will be described hereinafter with reference to FIGS. 1 and 2.

FIG. 1 is a sectional view schematically showing an OLED according to the related art.

FIG. 2 is an enlarged sectional view of a part "A" of FIG. 1, which shows a non-display area NA as panel edge portion of the related art OLED.

An OLED device 10 according to the related art, as shown in FIGS. 1 and 2, includes a first substrate 11 having a switching TFT (not shown), a driving TFT (not shown) and an organic light emitting diode (OLED) (not shown), and a second substrate 41 facing and encapsulating the first substrate 11. The first and second substrates 11 and 41 are spaced apart from each other, and attached to each other with a seal pattern 47 at an edge portion of the first and second substrates 11 and 41.

Here, a gate line (not shown) and a data line (not shown) which intersect with each other on a boundary of each pixel region (not shown) are formed on a display area AA of the first substrate 11, and a power line (not shown) may be formed in series with the gate line or the data line.

Each pixel region is provided with the switching TFT and the driving TFT.

A semiconductor layer 13 is formed on each pixel region within the display area AA of the first substrate 11, in correspondence with a driving region (not shown) and a switching region (not shown). The semiconductor layer 13 is made of silicon. The semiconductor layer 13 includes an active region 13a disposed at a central portion thereof for forming a channel region, and a source region 13b and a drain region 13c formed at both sides of the active region 13A with high levels of impurities doped thereon.

A gate insulating layer 15 is formed on the first substrate 11 including the semiconductor layer 13.

A gate electrode 17 facing the active region 13a of the semiconductor layer 13 and the gate line (not shown) connected to the gate electrode 17 are formed on each pixel region within the display area AA.

Also, a first interlayer insulating layer 19 is formed on the gate insulating layer 15 having the gate electrode 17 and the gate line. Here, the interlayer insulating layer 19 and its lower gate insulating layer 15 include first and second semiconductor contact holes (not shown), respectively, to expose the source region 13b and the drain region 13c located at both sides of the active region 13a.

A source electrode 21 and a drain electrode 23 are formed on the first interlayer insulating layer 19 having the first and second semiconductor contact holes within each pixel region P. The source electrode 21 and the drain electrode 23 are spaced apart from each other and contact the source region 13b and the drain region 13c which are exposed through the first and second semiconductor contact holes.

In addition, a second interlayer insulating layer 25 is formed on the first interlayer insulating layer 19, which is exposed between the source electrode 21 and the drain electrode 23, within each pixel region P. The second interlayer insulating layer 25 includes a drain contact hole (not shown) for exposing the drain electrode 23 therethrough.

Here, the source electrode 21 and the drain electrode 23, the semiconductor layer 13 having the source region 13b and the drain region 13c, which contact those electrodes 21 and 23, and the gate insulating layer 15 and the gate electrode 17 both formed on the semiconductor layer 13 constitute the driving TFT (not shown).

Although not shown, the switching TFT (not shown) has the same structure as the driving TFT, and is connected to the driving TFT.

A first electrode 27, an organic light emitting layer 31 and a second electrode 33 are sequentially formed on an area where an image is actually displayed at the second interlayer insulating layer 25.

Here, the first and second electrodes 27 and 31 and the organic light emitting layer 31 interposed between the electrodes 27 and 31 constitute an organic light emitting diode (OLED) (or will be referred to as an organic electroluminescent (EL) diode) (not shown).

The first electrode 27 is electrically connected to the drain electrode 23 of the driving TFT. Here, the first electrode 27 serves as an anode, and the second electrode 33 serves as a cathode.

Accordingly, light from the organic light emitting layer 31 is emitted through the first electrode 27 according to a bottom emission method.

The organic light emitting layer 31 may have a single layer made of a light emitting material, or have multiple layers including a hole injection layer, a hole transport layer, an emitting material layer, an electron transport layer and an electron injection layer for improving emission efficiency.

Referring to FIGS. 1 and 2, the first electrode 27 is formed in each pixel region P, and a bank 29 is located between the adjacent first electrodes 27 formed in each pixel region P. Here, the bank 29 has a matrix shape of a lattice structure, and corresponds to a border between the adjacent pixel regions P such that the first electrode 27 is separated for each pixel region P.

A passivation layer 35 made of silicon nitride (SiNx) for preventing permeation of moisture is formed on the second electrode 33 which is formed on an entire surface of the organic light emitting layer 31 having the bank 29.

In addition, the first and second substrates 11 and 41 are attached to each other with a seal pattern 47 at the edge portion thereof. Accordingly, the OLED device 10 is encapsulated.

The seal pattern 47 seals the display area AA to prevent oxygen or moisture from being permeated into the display region AA. The seal pattern 47 is formed on the non-display area NA surrounding an edge portion of the display area AA.

In the related art OLED device 10 having the configuration, the first and second substrates 11 and 41 are attached to each other more strongly with the seal pattern 47.

Consequently, contaminants such as external moisture or gas from may be prevented from being permeated into a spaced gap between the first and second substrates 11 and 41.

In the meantime, to attach the first substrate 11 and the second substrate 41 to each other, an adhesive layer 45 is interposed between the first substrate 11, which includes the non-display area NA as the panel edge portion and the display area AA having each pixel region (not shown), and the second substrate 41.

Therefore, in the OLED device 10 according to the related art, when a predetermined voltage is applied to the first electrode 27 and the second electrode 33 in response to a selected color signal, holes injected from the first electrode 27 and electrons applied from the second electrode 33 are transported to the organic light emitting layer 31 and accordingly excitons are generated by the hole and the electrons. Light is generated by transition from an excited state into a ground state of the excitons. The light is then emitted in form of visible rays. Here, since the emitted light is emitted outwardly through the transparent first electrode 27, so that the OLED device 10 can display an image.

However, the related art OLED having the aforementioned configuration has the following shortcomings.

According to the related art OLED device, a single passivation layer is used to protect the OLED device from moisture. As shown in FIG. 2, when a foreign material 51 which is several μm large is present, it acts as a defect. Accordingly, moisture is permeated into the corresponding portion, which makes it difficult to ensure a lifespan of the device sufficiently.

Also, the passivation layer is usually made of silicon nitride (SiNx). The silicon nitride is deposited at low speed. Hence, in order to reduce the affection by a foreign material more than several μm in size, the silicon nitride has to be deposited thicker than several μm. However, this disadvantageously increases the deposition time, causing an increase in fabricating costs accordingly.

SUMMARY OF THE INVENTION

Therefore, to overcome the shortcomings of the related art, an aspect of the detailed description is to provide an organic electroluminescent display (OLED) device capable of preventing permeation of external moisture and oxygen, and a method of fabricating the same.

To achieve these and other advantages and in accordance with the purpose of this specification, as embodied and broadly described herein, there is provided an organic light emitting diode (OLED) device including a first substrate defined by a display area having a plurality of pixels thereon and a panel edge portion surrounding the display area, a thin film transistor formed on the display area of the first substrate, a first electrode formed on the first substrate and connected to the thin film transistor, a bank formed on the first substrate and defining an opening of each pixel, an organic light emitting layer formed on the display area of the first substrate, a second electrode formed on an entire surface of the first substrate having the organic light emitting layer, an anti-moisture permeation pattern formed on the second electrode on the bank located at the panel edge portion, a passivation layer formed on an entire surface of the first substrate including the anti-moisture permeation pattern and the second electrode, a second substrate attached to the first substrate, and an adhesive layer interposed between the first and second substrates to attach the substrates to each other.

To achieve these and other advantages and in accordance with the purpose of this specification, as embodied and broadly described herein, there is provided a method for fabricating an organic light emitting diode (OLED) device including providing a first substrate defined by a display area having a plurality of pixels thereon and a panel edge portion surrounding the display area, forming a thin film transistor on the display area of the first substrate, forming a first electrode on the first substrate to be connected to the thin film transistor, forming a bank to define an opening of each pixel, forming an organic light emitting layer on the first electrode, forming a second substrate on an entire surface of the first substrate including the organic light emitting layer, forming an anti-moisture permeation pattern on the second electrode on the banks located at the panel edge portion, forming a passivation layer on an entire surface of the first substrate including the anti-moisture permeation pattern and the second electrode, and attaching the first substrate and the second substrate with interposing an adhesive layer therebetween.

An organic light emitting diode (OLED) device and a fabricating method thereof will provide the following effects.

A polymer may be coated for planarization of foreign materials and preventing moisture permeation prior to depositing a passivation layer between a non-display area as a panel edge portion and a display area, which may prevent defect of the passivation layer and moisture permeation from the panel edge portion, resulting in extending a device lifespan.

Also, passivation layers may be formed through processes before and after coating a polymer for preventing moisture permeation, so as to implement a multi-passivation layer structure, which may result in minimizing deterioration of a yield due to the moisture permeation.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 5 is an enlarged sectional view of a part "B" of FIG. 4, which shows a boundary portion between a non-display area NA as a panel edge portion of the OLED device and a display area AA;

DETAILED DESCRIPTION OF THE INVENTION

Description will now be given in detail of a structure of an organic light emitting diode (OLED) device in accordance with the exemplary embodiments, with reference to the accompanying drawings. For the sake of brief description with reference to the drawings, the same or equivalent components will be provided with the same reference numbers, and description thereof will not be repeated.

Figure 1:
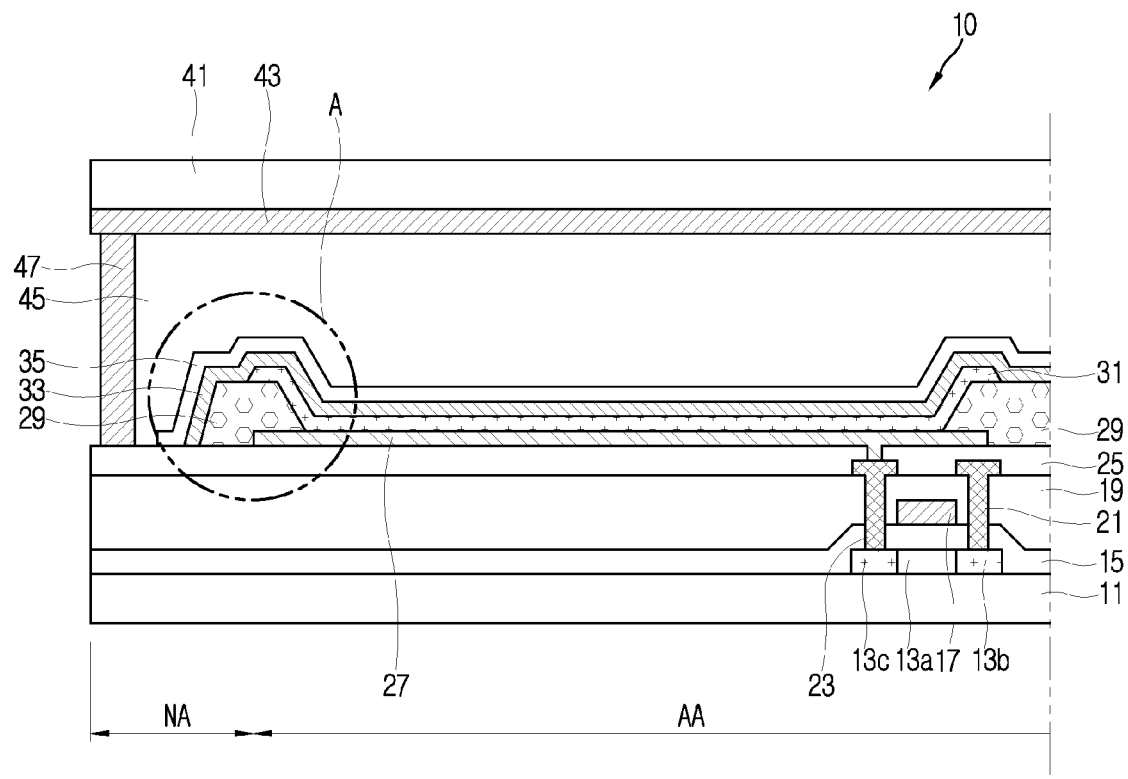
FIG. 1 is a sectional view schematically showing an OLED device according to the related art.
Figure 2:
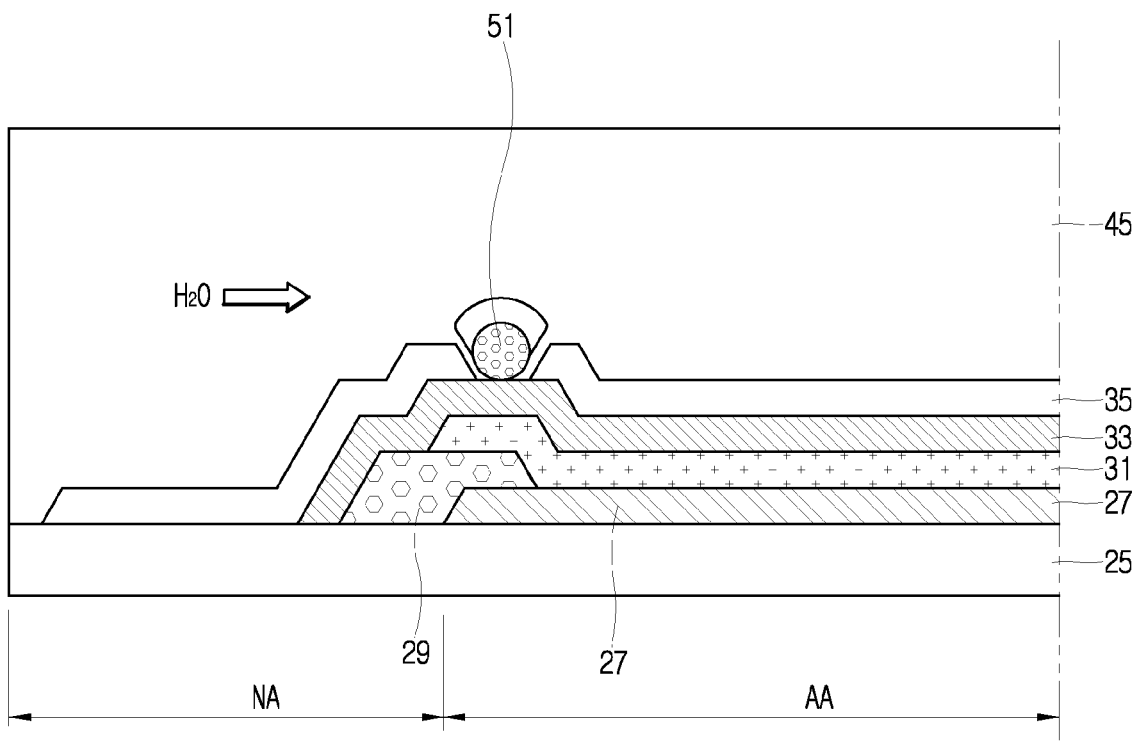
FIG. 2 is an enlarged sectional view of a part "A" of FIG. 1, which shows a non-display area NA as a panel edge portion of the related art OLED device.
Figure 3:
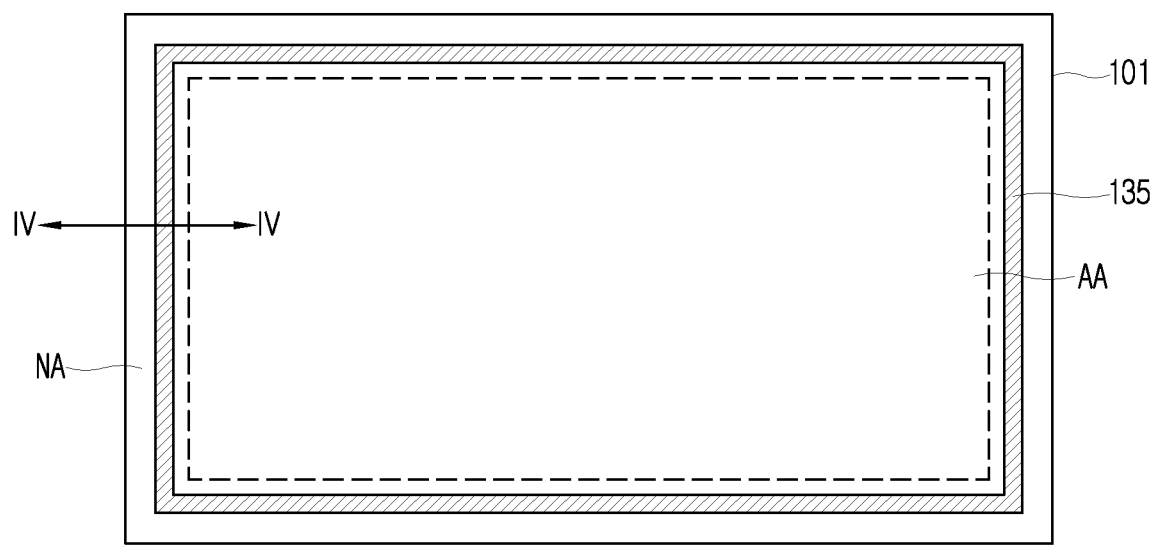
FIG. 3 is a planar view schematically showing an OLED device according to an exemplary embodiment of the present disclosure.
Figure 4:
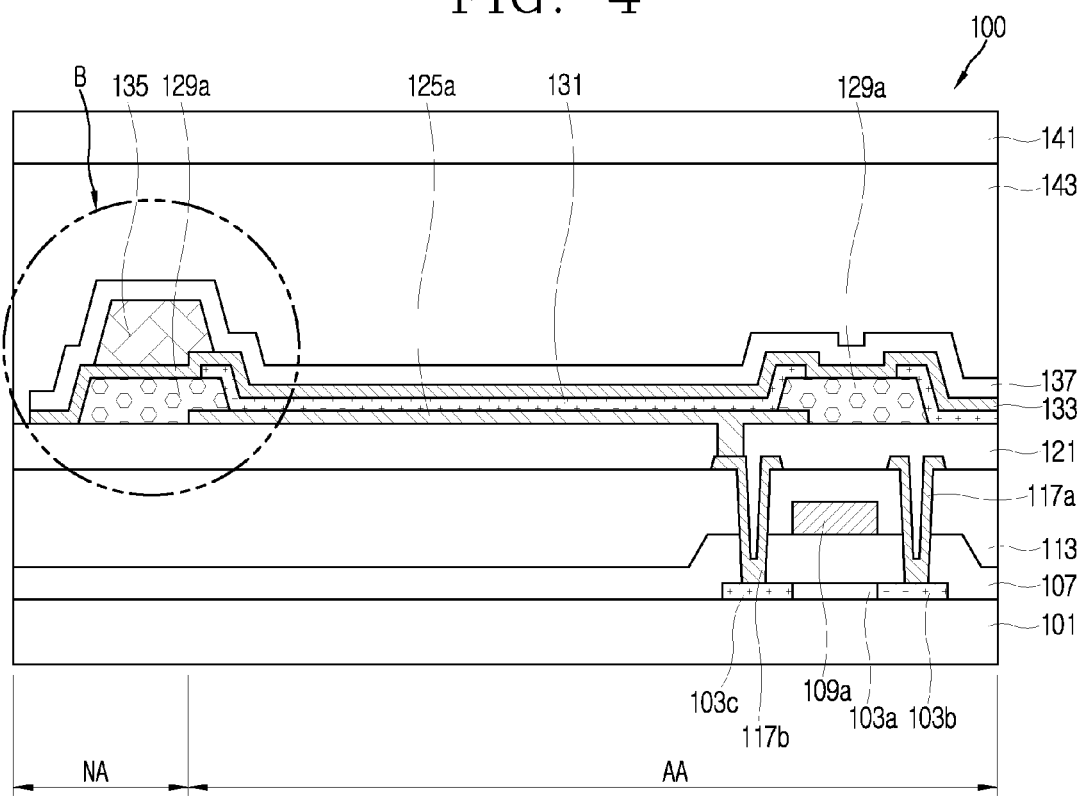
FIG. 4 is a sectional view taken along the line IV-IV of FIG. 3.

FIG. 3 is a planar view schematically showing an OLED device according to an exemplary embodiment of the present disclosure, FIG. 4 is a sectional view taken along the line IV-IV of FIG. 3, and FIG. 5 is an enlarged sectional view of a part "B" of FIG. 4, which shows a boundary portion between a non-display area NA as a panel edge portion of the OLED device and a display area AA.

OLED devices are classified into a top emission type and a bottom emission type according to an emission direction of light. Hereinafter, the bottom emission type OLED device will be described.

An OLED device 100 according to the present disclosure, as shown in FIGS. 3 to 5, may include a first substrate 101 having a switching TFT (not shown), a driving TFT DTr and an organic light emitting diode (OLED) (not shown), a second substrate 141 attached to the first substrate 101 in a facing manner, and an adhesive layer 143 made of a face seal for attaching the first substrate 101 and the second substrate 141 to each other.

Here, a gate line (not shown) and a data line (not shown) which intersect with each other on a boundary of each pixel region (not shown) are formed within a display area AA of the first substrate 11, and a power line (not shown) may be formed in series with the gate line or the data line.

Each pixel region is provided with the switching TFT and the driving DTr.

A semiconductor layer 103 may be formed on each pixel region within the display area AA of the first substrate 101, in correspondence with a driving region (not shown) and a switching region (not shown). The semiconductor layer 103 may be made of silicon, and include an active region 103a located at a central portion thereof and forming a channel region, and a source region 103b and a drain region 103c formed at both sides of the active region 103a with high levels of impurities doped thereon.

A gate insulating layer 107 may be formed on the first substrate 101 including the semiconductor layer 103.

A gate electrode 109a facing the active region 103a of the semiconductor layer 103 and the gate line (not shown) connected to the gate electrode 109a may be formed on each pixel region within the display area AA.

Also, a first interlayer insulating layer 113 may be formed on the gate insulating layer 107 having the gate electrode 109a and the gate line. Here, the interlayer insulating layer 113 and its lower gate insulating layer 107 may include first and second semiconductor contact holes (see 113a and 113b in FIG. 6D), respectively, to expose the source region 103b and the drain region 103c located at both sides of the active region 103a.

A source electrode 117a and a drain electrode 117b may be formed on the first interlayer insulating layer 113 having the first and second semiconductor contact holes 113a and 113b within each pixel region P. The source electrode 117a and the drain electrode 117b may be spaced apart from each other and contact the source region 103b and the drain region 103c which are exposed through the first and second semiconductor contact holes 113a and 113b, respectively.

A second interlayer insulating layer 121 may be formed on the first interlayer insulating layer 113, which is exposed between the source electrode 117a and the drain electrode 117b, within each pixel region P. The second interlayer insulating layer 121 may include a drain contact hole (not shown) for exposing the drain electrode 117b therethrough.

Here, the source electrode 117A and the drain electrode 117B, the semiconductor layer 103 having the source region 103b and the drain region 103c, which contact those electrodes 117A and 117b, the gate insulating layer 107 formed on the semiconductor layer 103, and the gate electrode 109a may constitute the driving TFT DTr.

Although not shown, the switching TFT (not shown) has the same structure as the driving TFT, and may be connected to the driving TFT.

The switching TFT and the driving TFT DTr are exemplarily illustrated in the drawings as a top gate type in which the semiconductor layer 103 is made of poly silicon. Meanwhile, as a variation, the switching TFT and the driving TFT DTr may be implemented as a bottom gate type in which the semiconductor layer 103 is made of pure and impure amorphous silicon.

A first electrode 125a, an organic light emitting layer 131 and a second electrode 133 may be sequentially formed on an area where an image is actually displayed at the second interlayer insulating layer 121.

Here, the first electrode 125a, the second electrode 133, and the organic light emitting layer 131 interposed therebetween may constitute the OLED E.

The first electrode 125a may be electrically connected to the drain electrode 117b of the driving TFT. The first electrode 125a may preferably be made of Indium Tin Oxide (ITO), which is a material having a relatively high work function value, so as to serve as an anode.

Here, the first electrode 125a may be formed on each pixel region. A bank 129a may be located between the first electrodes 125a formed on the adjacent pixel regions. Here, the bank 129a may be formed on the first substrate 101 in a matrix pattern of a lattice structure. The bank 129a may define an opening for each pixel region and corresponds to a border between the adjacent pixel regions P such that the first electrode 125a is separated for each pixel region P. Also, the bank 129a may be formed on the outermost portion of the display area AA, on the non-display area NA or all over the outermost portion of the display area AA and the non-display area NA.

The organic light emitting layer 131 may be formed on the first electrode 125a located in the pixel region. Light from the organic light emitting layer 131 may downwardly be emitted through the first electrode 125a according to a bottom emission method.

The organic light emitting layer 131 may have a single layer made of a light emitting material. Or, although not shown, the organic light emitting layer 131 may have multiple layers including a hole injection layer, a hole transport layer, an emitting material layer, an electron transport layer and an electron injection layer for improving emission efficiency.

The second electrode 133 may be formed on an entire surface of the first substrate 101 having the organic light emitting layer 131 and the bank 129a. Here, the second electrode 133 may be made of aluminum (Al) or aluminum alloy (e.g., AlNd) having a relatively low work function value so as to serve as a cathode.

Also, an anti-moisture permeation pattern 135 may be formed on the non-display area NA as a panel edge portion defined on the first substrate 101. The anti-moisture permeation pattern 135 may prevent foreign materials from being generated on a passivation layer 137, which will be formed during the succeeding process, or prevent moisture generated due to the foreign materials from being permeated into the display area AA. Especially, the anti-moisture permeation pattern 135 may be formed along an outer circumferential portion of the non-display area NA as the panel edge portion to surround the display area AA, thereby preventing moisture from being permeated into the panel from the panel edge portion. The anti-moisture permeation pattern 135 may preferably be formed on the bank 129a, which is located within the non-display area NA as the panel edge portion, but may not be limited to the position. The anti-moisture permeation pattern 135 may also be formed on an area located within the panel edge region, for example, an area through which moisture is permeated the most easily.

The anti-moisture permeation pattern 135 may be implemented as a polymer layer. The polymer layer may be more than several μm in thickness, which may allow for overcoming the drawbacks of the related art, namely, unable planarization due to damage on the passivation layer 137, which is formed through the succeeding process, caused by a foreign material larger than several μm, or moisture permeation due to the foreign material.

The passivation layer 137 may be formed on an entire surface of the first substrate 101 having the anti-moisture permeation pattern 135.

An another exemplary embodiment of the present disclosure, prior to forming the anti-moisture permeation pattern 135, a first passivation layer (not shown) may be formed on the entire surface of the substrate having the second electrode 133. Afterwards, the anti-moisture permeation pattern 135 may be formed on the first passivation layer and then a second passivation layer 137 may be formed on the anti-moisture permeation pattern 135.

Here, when the first passivation layer is formed prior to the formation of the anti-moisture permeation pattern 135, the planarization may not be achieved due to a foreign material generated on the first passivation layer. On the contrary, when the anti-moisture permeation pattern 135 is formed on the first passivation layer containing the foreign material, the anti-moisture permeation pattern 135 may cover the foreign material. This may allow for the planarization and prevent permeation of moisture generated due to the foreign material. That is, the passivation layers may be formed before and after forming the anti-moisture permeation pattern, respectively, so as to have a multi-passivation layer structure. This may result in minimizing deterioration of a yield due to the permeation of moisture.

The second substrate 141 may be attached onto the first substrate 101 using the adhesive layer 143 made of a face seal, thereby preventing contaminants such as externally introduced moisture or gas from being permeated into the display area within the first and second substrates 101 and 141.

With the configuration of the OLED device 100, when a predetermined voltage is applied to the first electrode 125a and the second electrode 133 in response to a selected color signal, holes injected from the first electrode 125a and electrons applied from the second electrode 133 may be transported to the organic light emitting layer 131, and accordingly excitons may be generated by the holes and the electrons. Accordingly, light may be generated by transition from an excited state into a ground state of the electrons. The generated light may thusly be emitted in form of visible rays through the transparent first electrode 125a, so that the OLED device 100 can display an image.

Hereinafter, description will be given of a method for fabricating an OLED device in accordance with an exemplary embodiment with reference to FIGS. 6A to 6M.

FIGS. 6A to 6M are sectional views showing fabricating processes of an OLED device according to an exemplary embodiment of the present disclosure.

OLED devices are classified into a top emission type and a bottom emission type according to an emission direction of light. Hereinafter, the bottom emission type OLED device will be described.

Figure 6A:
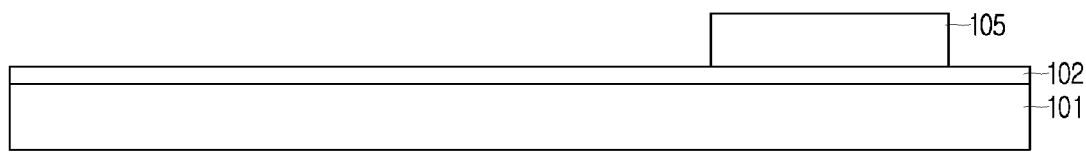
FIGS. 6A to 6M are sectional views showing fabricating processes of an OLED device according to an exemplary embodiment of the present disclosure.

As shown in FIG. 6A, amorphous silicon may be deposited on a first substrate 101 to form an amorphous silicon layer (not shown). Laser beams may be irradiated to or heat treatment may be carried out for the amorphous silicon layer such that the amorphous silicon layer can be crystallized into a poly silicon layer 102.

Next, a first photosensitive film (not shown) may be coated on the poly silicon layer 102, and then patterned into a first photosensitive film pattern 105.

Figure 6B:
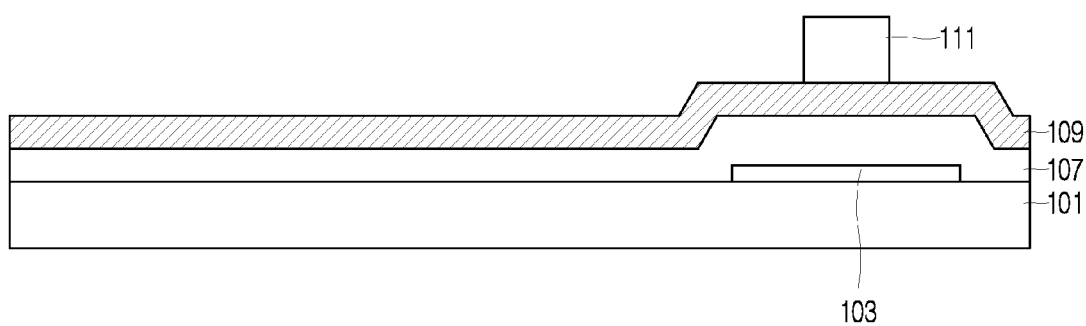

As shown in FIG. 6B, the poly silicon layer 102 may be etched using the first photosensitive film pattern 105 as an etching mask, thereby forming a semiconductor layer 103 in a pure poly silicon state. Here, prior to forming the amorphous silicon layer, an inorganic insulating material, for example, silicon oxide $SiO_2$ or silicon nitride SiNx, may be deposited on an entire surface of the first substrate 101 so as to form a buffer layer (not shown).

After removing the first photosensitive film pattern 105, silicon oxide $SiO_2$ may be deposited on the first substrate 101 having the semiconductor layer 103, thereby forming a gate insulating layer 107.

Afterwards, one of low-resistance metals, for example, aluminum (Al), aluminum alloy (e.g., AlNd), copper (Cu) and copper alloy, may be deposited on the gate insulating layer 107, thereby forming a first metal layer 109. A second photosensitive film (not shown) may be coated on the first metal layer 109.

The second photosensitive film may then be patterned into a second photosensitive film pattern 111 through a masking process.

Figure 6C:
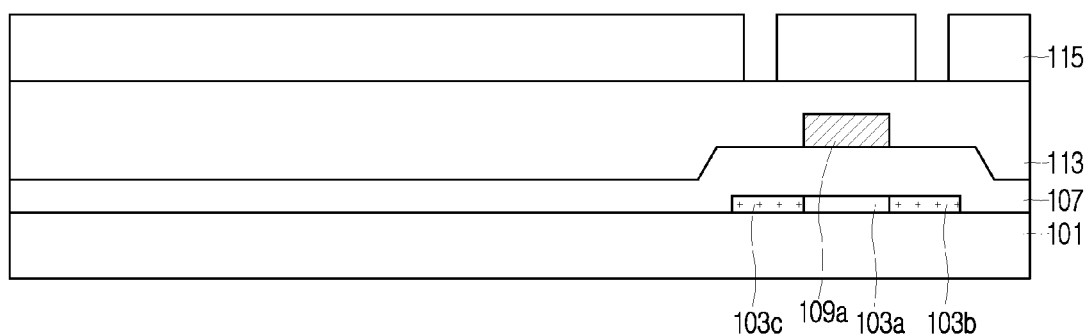

As shown in FIG. 6C, the first metal layer 109 may be etched using the second photosensitive film pattern 111 as an etching mask, thereby forming a gate electrode 109a.

After removing the second photosensitive film pattern 111, impurities, namely, triad or pentad may be doped on an entire surface of the first substrate 101 using the gate electrode 109a as a blocking mask, forming a source region 103b and a drain region 103c of a semiconductor layer 103 on portions located outside the gate electrode 109a. A portion of the semiconductor layer 103 corresponding to a lower portion of the gate electrode 109a which is not doped may form an active region 103a of the pure poly silicon Afterwards, one of inorganic insulating materials, such as silicon oxide ($SiO_2$) or silicon nitride (SiNx), may be deposited on the gate insulating layer 107 having the gate electrode 109a, thereby forming a first interlayer insulating layer 113. A third photosensitive film (not shown) may be coated on the first interlayer insulating layer 113.

Next, the third photosensitive film may be patterned into a third photosensitive film pattern 115 through a masking process.

Figure 6D:
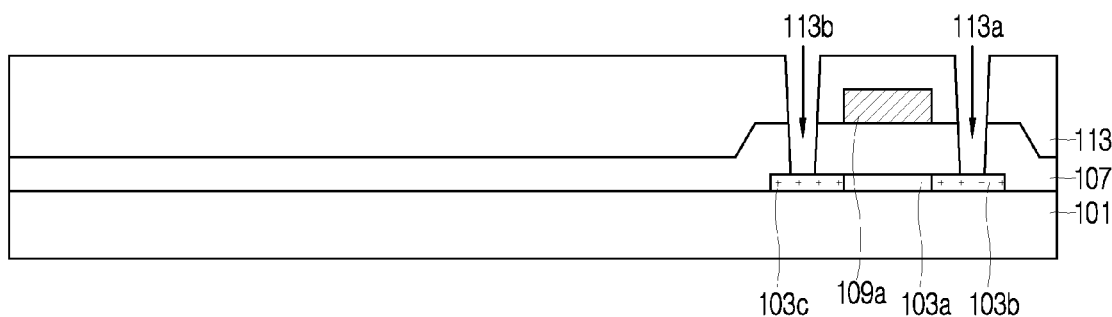

As shown in FIG. 6D, the first interlayer insulating layer 13 and the lower gate insulating layer 107 may be etched sequentially using the third photosensitive film pattern 115 as an etching mask, thereby forming first and second semiconductor contact holes 113a and 113b for exposing the source region 103b and the drain region 103c, respectively.

Figure 6E:
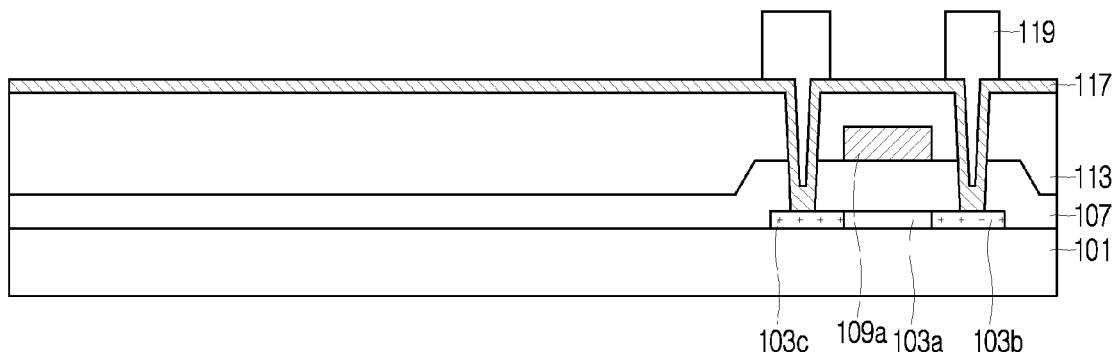

As shown in FIG. 6E, after removing the third photosensitive film pattern 115, one of metals, for example, aluminum (Al), aluminum alloy (e.g., AlNd), copper (Cu) and copper alloy, may be deposited on the first interlayer insulating layer 113 having the first and second semiconductor contact holes 113a and 113b, so as to form a second metal layer 117. A fourth photosensitive film (not shown) may be coated on the second metal layer 117.

The fourth photosensitive film may be patterned into a fourth photosensitive film pattern 119 through a masking process.

Figure 6F:
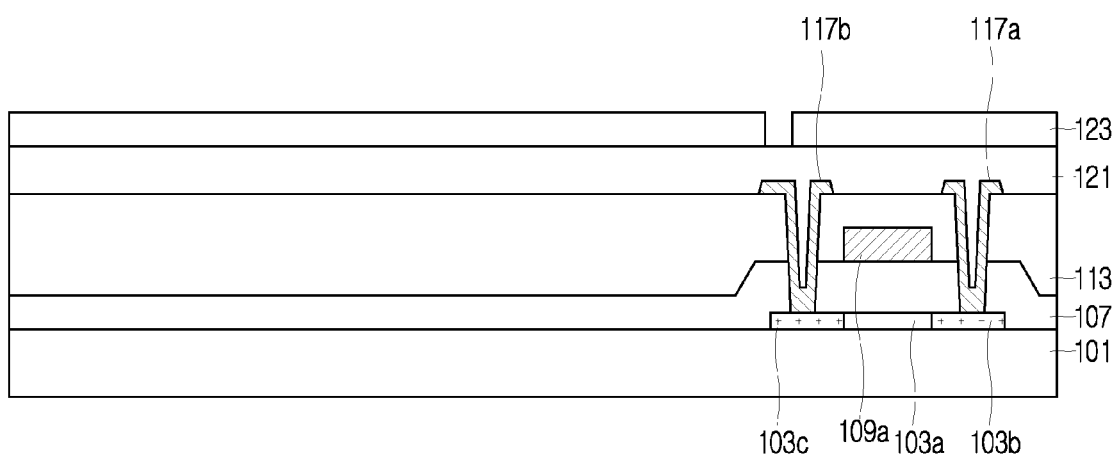

As shown in FIG. 6F, the second metal layer 117 may be etched using the fourth photosensitive film pattern 119 as an etching mask, thereby forming a source electrode 117a and a drain electrode 117b which contact the source region 103b and the drain region 103c via the first and second semiconductor contact holes 113a and 113b, respectively. Here, the semiconductor layer 103, the gate insulating layer 107, the gate electrode 109a, the first interlayer insulating layer 113 and the source and drain electrodes 117a and 117b spaced apart from each other may constitute a driving TFT DTr. Although not shown, a switching TFT (not shown) has the same structure as the driving TFT DTr and may be connected to the driving TFT DTr.

The switching TFT and the driving TFT DTr are exemplarily illustrated in the drawings as a top gate type in which the semiconductor layer 103 is made of poly silicon. Meanwhile, as a variation, the switching TFT and the driving TFT DTr may be implemented as a bottom gate type in which the semiconductor layer 103 is made of pure and impure amorphous silicon.

After removing the fourth photosensitive film pattern 119, an inorganic insulating material, such as silicon oxide $SiO_2$ or silicon nitride SiNx, may be deposited on the entire surface of the first substrate 101, to form a second interlayer insulating layer 121. A fifth photosensitive film (not shown) may be coated on the second interlayer insulating layer 121.

The fifth photosensitive film may be patterned into a fifth photosensitive film pattern 123 through a masking process.

Figure 6G:
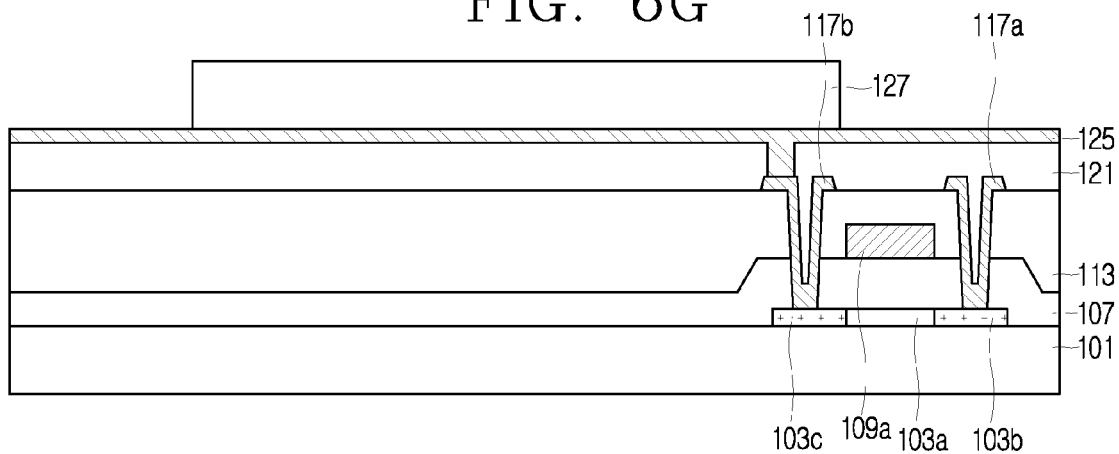

As shown in FIG. 6G, the second interlayer insulating layer 121 may be etched by using the fifth photosensitive film pattern 123 as a mask, thereby forming a drain contact hole (reference numeral not given) for exposing the drain electrode 117b therethrough.

After removing the fifth photosensitive film pattern 123, a transparent conductive material, such as ITO or IZO, may be deposited on the second interlayer insulating layer 121 having the drain contact hole, thereby forming a transparent conductive layer 125.

After coating a sixth photosensitive film (not shown) on the transparent conductive layer 125, the sixth photosensitive film may be patterned into a sixth photosensitive film pattern 127 through a masking process.

Figure 6H:
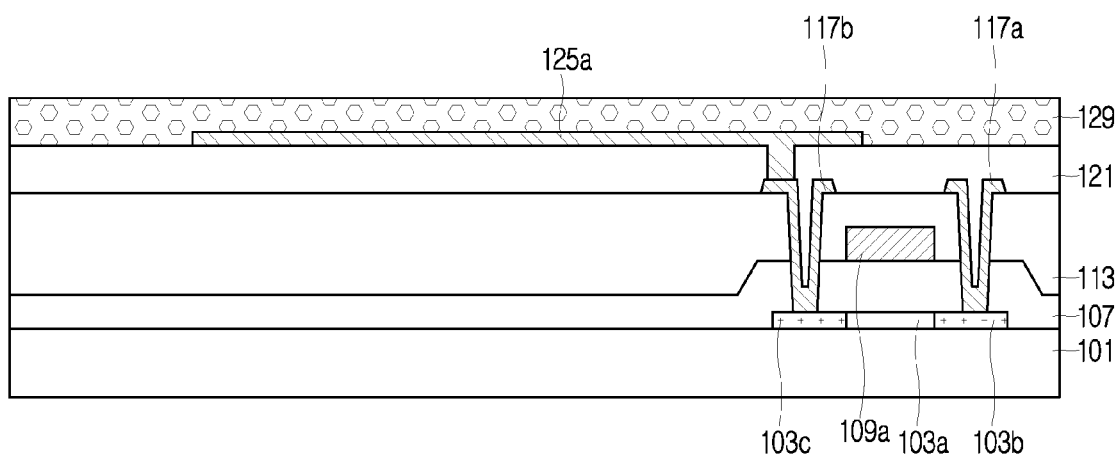

As shown in FIG. 6H, the transparent conductive layer 125 may be etched using the sixth photosensitive film pattern 127 as an etching mask, thereby forming a first electrode 125a. Here, the first electrode 125a, a second electrode (see 133 of FIG. 6J) to be formed through the succeeding process, and an organic light emitting layer 131 may constitute an OLED (not shown).

The first electrode 125a may be electrically connected to the drain electrode 117b of the driving TFT DTr. The first electrode 125a may preferably be made of ITO as a material having a relatively high work function value so as to serve as an anode.

Still referring to FIG. 6H, after removing the sixth photosensitive film pattern 127, an organic insulating layer 129 may be coated on the second interlayer insulating layer 121 having the first electrode 125a. Here, the organic insulating layer 129 may be made of an organic insulating material, such as photoresist or photoacryl having a photosensitive property.

Figure 6I:
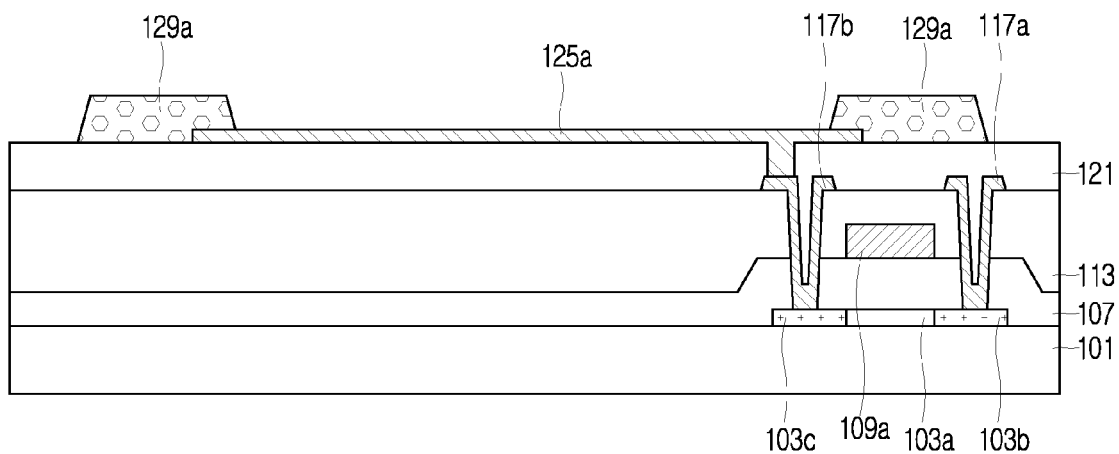

As shown in FIG. 6I, the organic insulating layer 129 may be selectively patterned to form a bank 129a which defines an opening for each pixel. Here, the bank 129a may be formed on a non-opening of a pixel located on the outermost portion of the display area AA adjacent to the non-display area NA, on the non-display area NA or all over the outermost portion of the display area AA and the non-display area NA.

Figure 6J:
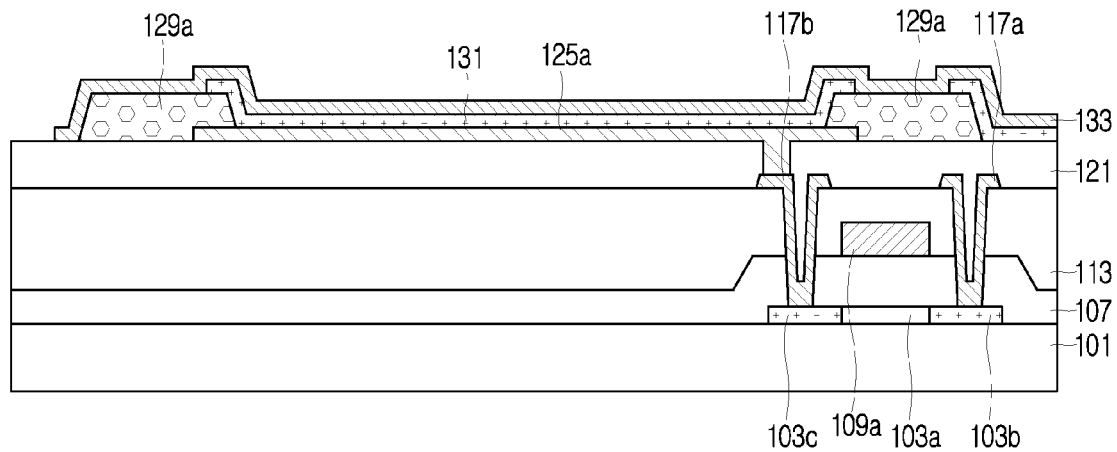

As shown in FIG. 6J, an organic light emitting layer 131 may be formed on the first electrode 125a located on the pixel region of the display area AA. Here, the first electrode 125a, a second electrode (see 133 of FIG. 6J) to be formed through the succeeding process, and the organic light emitting layer 131 may constitute an OLED E. Here, the organic light emitting layer 31 may have a single layer made of a light emitting material, or have multiple layers including a hole injection layer, a hole transport layer, an emitting material layer, an electron transport layer and an electron injection layer so as to improve emission efficiency.

A second electrode 133 may then be formed on the bank 129a having the organic light emitting layer 131. Here, the second electrode 133 may preferably be made of aluminum (Al) or aluminum alloy (e.g., AlNd) as a material having a relatively low work function value so as to serve as a cathode.

Figure 6K:
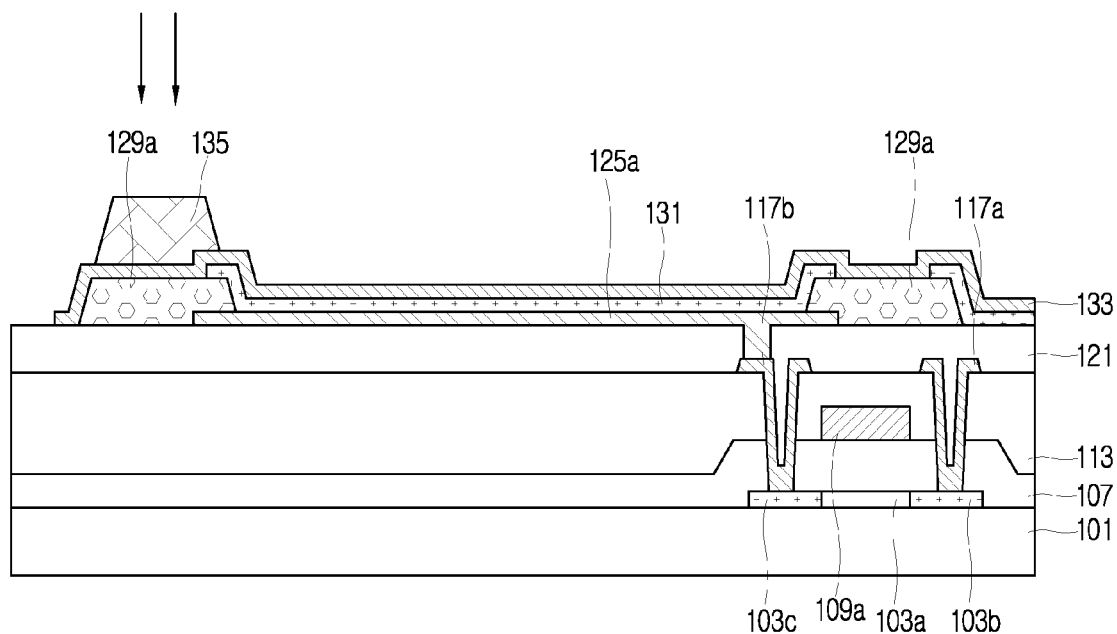

As shown in FIG. 6K, a polymer layer which is more than several µm in thickness may be coated on the second electrode 133 located within the non-display area NA as the panel edge portion, in a masking or printing manner using a mask, thereby forming an anti-moisture permeation pattern 135. Here, the anti-moisture permeation pattern 135 may be formed along an outer circumferential portion of the non-display area NA as the panel edge portion to surround the display area AA, so as to allow for leveling of foreign materials and prevent moisture permeation, thereby extending a lifespan of a device. Also, the panel edge portion may not be limited to the non-display area NA, but include the outermost portion of the display area AA, the non-display area NA and a region between the outermost portion of the display area AA and the non-display area NA.

Figure 6L:
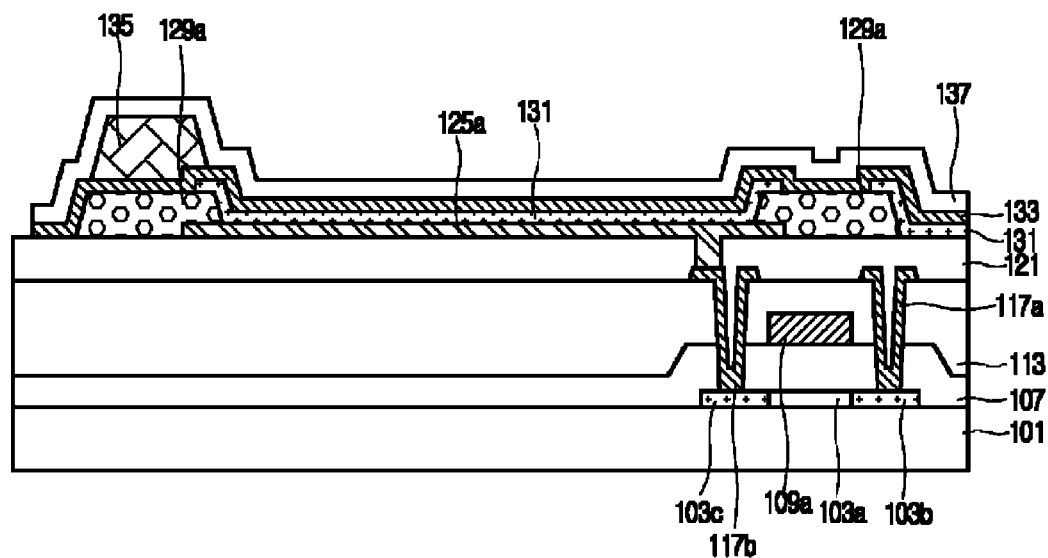

As shown in FIG. 6L, an inorganic insulating material, such as silicon oxide $SiO_2$ or silicon nitride SiNx may be deposited on the entire surface of the first substrate 101 having the anti-moisture permeation pattern 135 and the second electrode 133, thereby forming a passivation layer 137. Here, the passivation layer 137 may additionally be formed prior to the formation of the anti-moisture permeation pattern 135. Accordingly, as the passivation layer is formed before and after forming the polymer layer, respectively, the passivation layer may have a multi-passivation layer structure, minimizing deterioration of a yield due to the permeation of moisture.

Figure 6M:
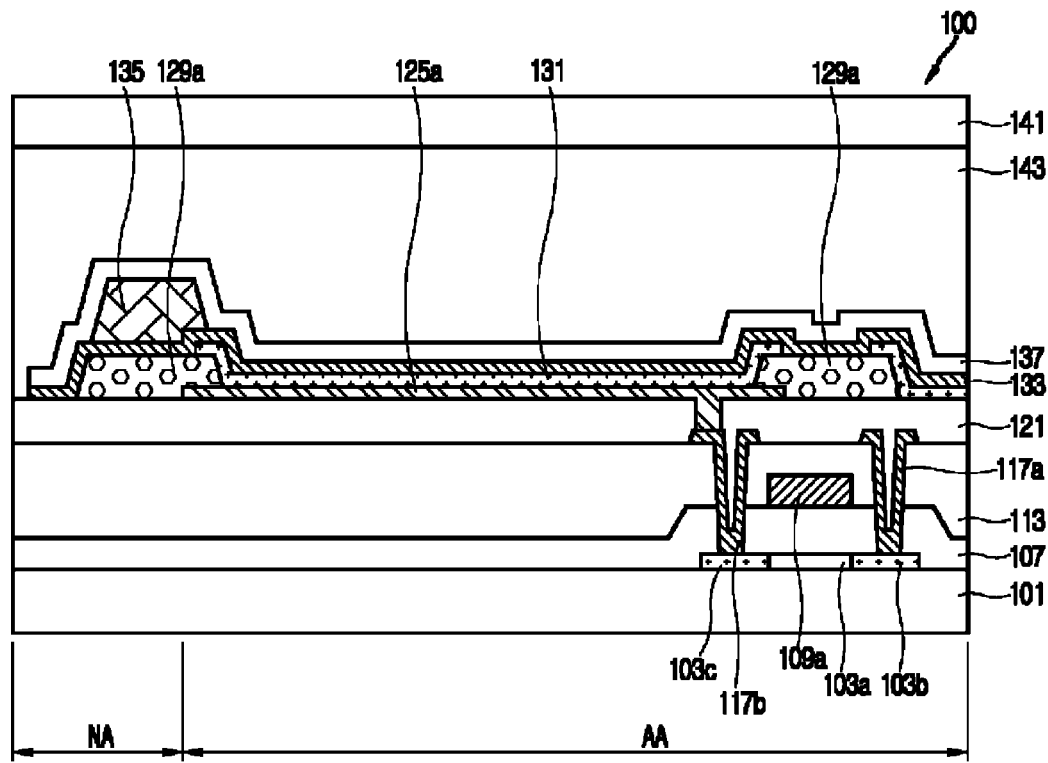

As shown in FIG. 6M, an adhesive layer 143 made of face seal may be formed between the first and second substrates 101 and 141 to attach them to each other, thereby encapsulating the first and second substrates 101 and 141.

As described above, in accordance with an OLED device and a fabricating method thereof according to the present disclosure, a polymer may be coated for planarization of foreign materials and preventing moisture permeation prior to depositing a passivation layer between a non-display area as a panel edge portion and a display area, which may prevent defect of the passivation layer and moisture permeation from the panel edge portion, resulting in extending a device lifespan.

Also, in accordance with the OLED device and the fabricating method thereof according to the present disclosure, passivation layers may be formed through processes before and after coating a polymer for preventing moisture permeation, so as to implement a multi-passivation layer structure, which may result in minimizing deterioration of a yield due to the moisture permeation.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An organic light emitting diode (OLED) device comprising:
    a first substrate defined by a display area having a plurality of pixels thereon and a panel edge portion surrounding the display area;
    a thin film transistor formed on the display area of the first substrate;
    a first electrode formed on the first substrate and connected to the thin film transistor;
    a bank formed on the first substrate and defining an opening of each pixel;
    an organic light emitting layer formed on the display area of the first substrate;
    a second electrode formed on an entire surface of the first substrate having the organic light emitting layer;
    an anti-moisture permeation pattern formed on the second electrode on the bank located at the panel edge portion;
    a passivation layer formed on an entire surface of the first substrate including the anti-moisture permeation pattern and the second electrode;
    a second substrate attached to the first substrate; and
    an adhesive layer interposed between the first and second substrates to attach the substrates to each other.

2. The device of claim 1, wherein the panel edge portion comprises the outermost portion of the display area, a non-display area and an area between the outermost portion of the display area and the non-display area.

3. The device of claim 1, wherein the anti-moisture permeation pattern is configured as a polymer layer.

4. The device of claim 1, wherein the anti-moisture permeation pattern is formed along an outer circumference of the panel edge portion to surround the display area.

5. The device of claim 1, further comprising a passivation layer formed between the anti-moisture permeation pattern and the second electrode.

6. A method for fabricating an organic light emitting diode (OLED) device comprising:
    providing a first substrate defined by a display area having a plurality of pixels thereon and a panel edge portion surrounding the display area;
    forming a thin film transistor on the display area of the first substrate;
    forming a first electrode on the first substrate to be connected to the thin film transistor;
    forming a bank to define an opening of each pixel;
    forming an organic light emitting layer on the first electrode;
    forming a second substrate on an entire surface of the first substrate including the organic light emitting layer;
    forming an anti-moisture permeation pattern on the second electrode on the banks located at the panel edge portion;
    forming a passivation layer on an entire surface of the first substrate including the anti-moisture permeation pattern and the second electrode; and
    attaching the first substrate and the second substrate with interposing an adhesive layer therebetween.

7. The method of claim 6, wherein the panel edge portion comprises the outermost portion of the display area, a non-display area and an area between the outermost portion of the display area and the non-display area.

8. The method of claim 6, wherein the anti-moisture permeation pattern is configured as a polymer layer.

9. The method of claim 6, wherein the anti-moisture permeation pattern is formed along an outer circumference of the panel edge portion to surround the display area.

10. The method of claim 6, further comprising forming a passivation layer between the anti-moisture permeation pattern and the second electrode.

* * * * *